United States Patent [19]

Sakai et al.

[11] Patent Number: 5,292,716
[45] Date of Patent: Mar. 8, 1994

[54] OXIDE SUPERCONDUCTING MATERIAL AND PROCESS FOR PRODUCING THE SAME

[75] Inventors: Hitoshi Sakai, Komaki; Hitoshi Yoshida, Okazaki; Hideyuki Baba, Nagoya; Manabu Yoshida, Aichi, all of Japan

[73] Assignee: NGK Insulators, Ltd., Nagoya, Japan

[21] Appl. No.: 820,783

[22] Filed: Jan. 15, 1992

[30] Foreign Application Priority Data

Jan. 18, 1991 [JP] Japan ................................. 3-18404
Jan. 7, 1992 [JP] Japan ................................. 4-693

[51] Int. Cl.$^5$ .................. C01F 17/00; C01G 3/02; H01L 1/08; H01L 39/12
[52] U.S. Cl. .................. 505/1; 252/518; 252/521; 505/780; 505/785
[58] Field of Search .......... 505/1, 785; 252/521, 252/518; 707/780, 785

[56] References Cited

U.S. PATENT DOCUMENTS

| | | | |
|---|---|---|---|
| 4,956,336 | 9/1990 | Salama | 505/1 |
| 5,084,436 | 1/1992 | Morimoto | 252/521 |

FOREIGN PATENT DOCUMENTS

| | | |
|---|---|---|
| 358997 | 3/1990 | European Pat. Off. . |
| 374263 | 6/1990 | European Pat. Off. . |
| 423375 | 4/1991 | European Pat. Off. . |
| 427209 | 5/1991 | European Pat. Off. . |
| 63-291814 | 11/1988 | Japan . |
| 2-153803 | 6/1990 | Japan . |

OTHER PUBLICATIONS

European search report.
"Copper Oxide Superconductor" by C. P. Poole, Jr., T. Datta and H. A. Farach (John Wiley & Sons, New York, 1988), pp. 122-130.
"Encyclopaedia Chimica", vol. 5, p. 388, right col., Kyoritsu Publishing Co., 1963, pp. 388-389.

*Primary Examiner*—Paul Lieberman
*Assistant Examiner*—John Boyd
*Attorney, Agent, or Firm*—Adduci, Mastriani, Schaumberg & Schill

[57] ABSTRACT

A RE-Ba-Cu-O type oxide superconducting material (RE represents Y, Nd, Sm, Eu, Gd, Dy, Ho, Er, Tm, Yb, Lu or a combination of two or more of them) having a phase structure including a $REBa_2Cu_3O_y$ phase and a $RE_2BaCuO_5$ phase of 20 μm or less in diameter dispersed in the $REBa_2Cu_3O_y$ phase, in which superconducting material RE consists of at least two elements selected from Y, Cl, Nd, Sm, Eu, Gd, Dy, Ho, Er, Tm, Yb and Lu. Said oxide superconducting material can be produced by melt processing.

3 Claims, No Drawings

OXIDE SUPERCONDUCTING MATERIAL AND PROCESS FOR PRODUCING THE SAME

BACKGROUND OF THE INVENTION AND RELATED ARTS STATEMENT

The present invention relates to an oxide superconducting material and a process for producing said superconducting material. More particularly, the present invention relates to a $REBa_2Cu_3O_y$ oxide superconducting material (RE represents Y, Ce, Nd, Sm, Eu, Gd, Tb, Dy, Ho, Er, Tm, Yb, Lu or a combination of two or more of them), in which superconducting material RE consists of at least two elements selected from Y, Ce, Nd, Sm, Eu, Gd, Tb, Dy, Ho, Er, Tm, Yb and Lu, and which superconducting material gives a high critical current density (Jc) even in a highly magnetic field, as well as to a process for producing said superconducting material by subjecting raw material powders containing the at least two RE elements, to melting, slow cooling and heat treatment in this order under particular conditions.

Oxide superconducting materials have high critical temperatures and vigorous research is under way in order to put them into practical use. For example, Japanese Patent Application Laid-Open No. 291814/1988 proposes, as an oxide superconducting material, a superconducting composition containing rare earth elements (Y and Ce) in obtaining an oxide superconducting material as a bulk material, sintering has heretofore been used generally. The oxide superconducting materials obtained by sintering have such a microstructure that the grains are fine and a number of grain boundaries exist inside. In these oxide superconducting bulk materials obtained by sintering, the superconducting grains are combined with each other by a weak-link, making it impossible to obtain a high Jc.

Meanwhile, in superconducting materials of single crystal structure, it is known that no grain boundary problems as mentioned above exist and that a high Jc is obtained even in a highly magnetic field. Hence, it was investigated to allow the superconducting material of microstructure obtained by sintering to approximate a single crystal structure. Furthermore it was proposed to disperse particles of a non-superconducting phase in a single crystal phase to fix the magnetic flux line, that is, to form pinning centers. For example, melting processes represented by the MTG process (the Melt Textured Growth process) were proposed. In the MTG process, a rare earth oxide superconducting material, for example, is slowly cooled generally from the incongruent melting point of the 123 phase [$REBa_2Cu_3O_y$ (RE is a rare earth element including Y)] to give rise to a peritectic reaction between the 211 phase ($RE_2BaCuO_5$) and the liquid phase to cause crystal growth; the 211 phase exists as particles inside the crystals because of an incomplete peritectic reaction after growth and provides pinning centers; as a result, the rare earth oxide superconducting material obtained shows a high Jc even in a magnetic field. The oxide superconducting material obtained by the MTG process, however, has various disadvantages in that the particles of the 211 phase are large and their distribution is non-uniform and that cracks exist along the direction of crystal growth.

Also, the QMG process (the Quench and Melt Growth process) was proposed in Japanese Patent Application Laid-Open No. 153803/1990, as an improved process for the MTG process. In the QMG process, raw materials for a rare earth oxide superconducting material are subjected to melting, quenching and solidification to obtain an intermediate comprising a Ba-Cu oxide phase and an $Y_2O_3$ phase or the like of 50 μm or less dispersed in said oxide phase, or $Y_2O_3$ and a Ba-Cu oxide are mixed to obtain a plate-like material of 5 mm or less in thickness or a linear material; the intermediate or the plate-like or linear material is heated at the incongruent melting point of the 123 phase to convert to a semi-molten state and then is cooled slowly from that temperature at a given cooling rate to give rise to a peritectic reaction between the 211 phase and the liquid phase to grow a 123 phase in which a 211 phase of 20 μm or less is finely and uniformly dispersed. According to the disclosure in the above document, the superconducting material obtained by the QMG process exhibits a very high pinning effect and gives an excellent Jc in a highly magnetic field. Further, the MPMG process (the Melt Powder and Melt Growth process) was proposed. In the MPMG process, a material obtained by melting, quenching and solidification according to the QMG process is ground for higher shapability and the obtained superconducting material is said to give the same high Jc as in the QMG process.

The QMG process and the MPMG process, as compared with the melting process, can exhibit a high pinning effect and give an excellent Jc, but require molding into a particular shape or two-stage melting (i.e. melting - quenching and solidification - semi-melting - slow cooling), making the procedure complex. Further, when the QMG process and the MPMG process are conducted via a step of a quenching and solidification to prevent the agglomeration of $Y_2BaCuO_5$ phase to obtain a finely dispersed structure, a platinum crucible is requisite but the platinum may react with the rare earth oxide superconducting material and may invite deterioration of or variation in superconductivity of the material. Moreover, a means for enabling the high-rate quenching is required. Therefore, there is desired a process which can produce industrially in a simple procedure an oxide superconducting material exhibiting the same properties as those obtained in the QMG process or the MPMG process.

SUMMARY OF THE INVENTION

An object of the present invention is to provide an oxide superconducting material which exhibits a very high pinning effect and gives an excellent Jc in a highly magnetic field similarly to those obtained by the QMG process and the MPMG process.

Another object of the present invention is to provide a process for producing the above oxide superconducting material giving an excellent Jc, by utilizing the simple procedure employed in melt processing.

According to the present invention, there is provided a RE-Ba-Cu-O oxide superconducting material (RE represents Y, Ce, Nd, Sm, Eu, Gd, Tb, Dy, Ho, Er, Tm, Yb, Lu or a combination of two or more of them) having a phase structure comprising a $REBa_2Cu_3O_y$ phase and a $RE_2BaCuO_5$ phase of 20 μm or less in diameter, dispersed in the $REBa_2Cu_3O_y$ phase, in which superconducting material RE consists of at least two elements selected from Y, Ce, Nd, Sm, Eu, Gd, Tb, Dy, Ho, Er, Tm, Yb and Lu.

According to the present invention, there is further provided a process for producing a RE-Ba-Cu-O type oxide superconducting material (RE represents Y, Ce, Nd, Sm, Eu, Gd, Tb, Dy, Ho, Er, Tm, Yb, Lu or a combination of two or more of them) having a phase structure comprising a $REBa_2Cu_3O_y$ phase and a $RE_2BaCuO_5$ phase of 20 μm or less in diameter dispersed in the $REBa_2Cu_3O_y$ phase, in which superconducting material RE consists of at least two elements selected from Y, Ce, Nd, Sm, Eu, Gd, Tb, Dy, Ho, Er, Tm, Yb and Lu, which process comprises (a) shaping raw material powders containing RE (RE consists of at least two elements selected from Y, Ce, Nd, Sm, Eu, Gd, Tb, Dy, Ho, Er, Tm, Yb and Lu), Ba and Cu, (b) heat-treating the shaped material at a temperature equal to or higher than the incongruent melting point of the oxide superconducting material to be finally obtained, and (c) subjecting the resulting material to slow cooling and heat treatment in this order, to obtain a $REBa_2Cu_3O_y$ oxide superconducting material.

The RE-Ba-Cu-O type oxide superconducting material (RE represents Y, Ce, Nd, Sm, Eu, Gd, Tb, Dy, Ho, Er, Tm, Yb, Lu or a combination of two or more of them) of the present invention contains at least two rare earth elements selected from Y, Ce, Nd, Sm, Eu, Gd, Tb, Dy, Ho, Er, Tm, Yb and Ly and comprises a $REBa_2Cu_3O_y$ phase and a $RE2BaCuO5$ phase of 20 μm or less in diameter uniformly dispersed in the $REBa_2Cu_3O_y$ phase. Accordingly, it is uniform as a whole and gives excellent superconductivity and a high Jc. The process for producing such an oxide superconducting material according to the present invention employs one-stage melting similarly to the conventional melt processing and yet can produce an oxide superconducting material having the same excellent superconductivity as exhibited by the oxide superconducting materials obtained by the QMG process and the MPMG process.

DETAILED DESCRIPTION OF THE INVENTION

The present invention is hereinafter described in more detail.

The RE-Ba-Cu-O type oxide superconducting material of the present invention has a multi-layered perovskite structure containing at least two rare earth elements selected from Y, Ce, Nd, Sm, Eu, Gd, Tb, Dy, Ho, Er, Tm, Yb and Lu. Said oxide superconducting material takes (1) a form represented by, for example, $(YDy)_1Ba_2Cu_3O_7$, wherein the RE of RE-Ba-Cu-O consists of two rare earth elements, i.e. a major RE component and a minor RE component, and/or (2) a form of a mixture consisting of (a) an oxide superconducting material containing at least one of the RE elements, having an ordinary multi-layered perovskite structure and (b) at least one of or one of others than the RE elements contained in the material (a) (the exact structure of said mixture is not known yet). In the present invention, RE includes Y, Ce, Nd, Sm, Eu, Gd, Tb, Dy, Ho, Er, Tm, Yb and Lu but excludes Sc, La and Pr because these three rare earth elements cannot exhibit the effects aimed at by the present invention. In the present invention, the RE-Ba-Cu-O type oxide superconducting material includes the above two forms having the $RE_2BaCuO_5$ phase.

The raw material powders containing RE, Ba and Cu elements, used for obtaining the RE-Ba-Cu-O type oxide superconducting material have no particular restriction as long as they are a mixed oxide powder of oxides of at least two rare earth elements selected from Y, Ce, Nd, Sm, Eu, Gd, Tb, Dy, Ho, Er, Tm, Yb and Lu, a carbonate, oxide or peroxide of - Ba and an oxide of Cu, a calcined powder obtained from said mixed oxide powder, a frit powder obtained from said mixed oxide powder, or the like, in which powder the individual raw materials are contained so as to constitute, after firing, $REBa_2Cu_3O_y$ and $RE_2BaCuO_5$.

The particle diameters of the raw material powders have no particular restriction, either, but are generally 20 μm or less, preferably as fine as 1-5 μm. The use of raw material powders having particle diameters of more than 20 μm is not preferable because they give a non-uniform composition at the incongruent melting point the desired oxide superconducting material. When there are used raw material powders having particle diameters of 1 μm or less, powders obtained by, for example, coprecipitation are preferred; however, powders obtained by other methods can also be used as long as they are fine powders of 1 μm or less.

In the present invention, the raw material powders are compounded so as to contain, as RE, at least two elements selected from Y, Ce, Nd, Sm, Eu, Gd, Tb, Dy, Ho, Er, Tm, Yb and Lu. In this case, it is generally preferable that the at least two elements consist of a major RE component (e.g. Y or Er) and a minor RE component consisting of at least one other rare earth element (e.g. Ce, Nd, Sm, Eu). The minor RE component is particularly preferably Ce. The content of oxide of the minor RE component is generally 0.1-10% weight, preferably 0.5-5% by weight in the obtained final oxide superconducting material. When the content is within the range, agglomeration of $RE_2BaCuO_5$ in the oxide superconducting material obtained is suppressed. However, when the content is outside the range, the suppression of $RE_2BaCuO_5$ agglomeration is not much expected. The suppression of $RE_2BaCuO_6$ agglomeration by the minor RE component in the oxide superconducting material of the present invention comprising a $REBa_2O_3O_y$ phase and a $RE_2BaCuO_5$ phase of 20 μm or less in diameter uniformly dispersed in the $REBa_2O_3O_y$ phase, has been found for the first time by the present inventors.

The reason for that the minor RE component suppresses the agglomeration of the $RE_2BaCuO_5$ phase, is not clear. However, the elemental analysis of the present oxide superconducting material by electron beam microanalyzer (EPMA) indicates that the at least two RE elements do not exist in the form of a complete solid solution and the minor RE component exists in the form of partial replacement of the major RE component and/or in the form of a compound containing substantially no major RE component. This compound containing the minor RE component is believed to have a close connection with suppression of the agglomeration of the $RE_2BaCuO_5$ phase.

The raw material powders as mentioned above are thoroughly mixed; the resulting mixed powder is shaped into a desired shape; the shaped material is heated to a temperature equal to or higher than the incongruent melting point of the oxide superconducting material to be obtained finally; the resulting material is cooled slowly as in the known melt processing and then subjected to a heat treatment in an oxygen atmosphere to obtain a rare earth oxide superconducting material of the present invention.

The shaping can be conducted according to a known method such as a doctor blade method, press molding method, slurry casting method or the like, to obtain a shaped material as a bulk material of rare earth oxide superconducting material. It is also possible to obtain a shaped material by spray- or powder-coating the above-mentioned mixed powder on a substrate made of a metal, a ceramic or the like to form a layer of rare earth oxide superconducting material on the substrate.

The temperature equal to or higher than the incongruent melting point of the desired $REBa_2Cu_3O_y$, used in the present invention, varies depending upon the kinds and combination of the RE elements used but is generally 1,050°-1,200° C. The temperature can be appropriately selected according to the material, etc. The elevation rate to said temperature is not particularly restricted. An ordinary elevation rate of about 10°-300° C./hr can be employed. The heat treatment is conducted by keeping the shaped material within the above temperature range for a given length of time. The length of time is not particularly restricted and, similarly to the above temperature range, can be appropriately selected depending upon the heating conditions, etc. But, it is generally 10 minutes to 3 hours.

The material after the above heat treatment is cooled slowly as in ordinary melt processing and then subjected to a heat treatment in an oxygen atmosphere at a given temperature to obtain a $REBa_2Cu_3O_y$ oxide superconducting material. In this case, the slow cooling can be conducted at a certain cooling rate or lower so as to assure crystal growth, but is ordinarily conducted preferably at a rate of 0.5°-5° C./hr. The heat treatment after slow cooling can be conducted at a temperature of 5000C or below for a time as long as possible in an oxygen atmosphere in order to obtain an oxide superconducting crystal phase containing a desired amount of oxygen, but is ordinarily conducted at 300°-500° C. for about 10-100 hours.

As described above, the $REBa_2Cu_3O_y$ oxide superconducting material of the present invention contains at least two rare earth elements selected from Y, Ce, Nd, Sm, Eu, Gd, Tb, Dy, Ho, Er, Tm, Yb and Lu, and can be obtained by substantially the same melting as employed in conventional melt processing, slow cooling and heat treatment.

In the conventional QMG process, when the raw material powders are not subjected to melting and quenching, a $RE_2BaCuO_5$ phase is formed at the incongruent melting point of the desired oxide superconducting material; the phase causes easy agglomeration and develops into large particles while the incongruent melting point is kept. Consequently, no oxide superconducting material giving a high Jc can be obtained. In contrast, in the oxide superconducting material of the present invention, agglomeration of the $RE_2BaCuO_5$ phase can be suppressed and the $RE_2BaCuO_5$ phase is finely dispersed as mentioned above by allowing the oxide superconducting material to contain at least two rare earth elements; as a result, the oxide superconducting material can give a high Jc.

EXAMPLES

The present invention is hereinafter described in more detail by way of Examples. However, the present invention is by no means restricted by the following Examples.

EXAMPLE 1 AND COMPARATIVE EXAMPLE 1

Powders Of $Y_2O_3$, $BaCO_3$ and CuO were compounded so that the atomic ratio of Y, Ba and Cu became 1.50:2.25:3.25, and mixed by a dry mixer for 1 hour. The resulting mixed powder was calcined at 700° C. for 10 hours in air. To the calcined product was added a rare earth element oxide powder or other element powder each shown in Table 1, 2, 3 or 4 (Tables 1-3 are for Example 1 and Table 4 is for Comparative Example 1), in such an amount that the content of said element oxide in the sintered material obtained became as shown in said Table. They were ground and mixed for 15 hours by a dry mixer using zirconia flint pebbles.

The resulting mixed powder was press-molded at a pressure of 1 ton/cm² into pellets of 20 mm in thickness and 30 mm in diameter.

The pellets were placed on a dense alumina setter in an electric furnace and subjected to temperature elevation to 1,150° C. in 10 hours in a nitrogen atmosphere. After the temperature elevation, dry air was introduced into the electric furnace and incongruent melting was effected at 1,150° C. for 1 hour in an air atmosphere. Then, the temperature was lowered to 1,050° C. in 1 hour, after which slow cooling was effected from 1,050° C. to 900° C. at a rate of 1° C./hr. Thereafter, oxygen was introduced into the furnace to convert the atmosphere inside the furnace to a 100% oxygen atmosphere, and the temperature was lowered to 500° C. at a rate of 20° C./hr. The pellets were subjected to a heat treatment for 30 hours at this temperature (500° C.) and then allowed to stand in the furnace until the temperature decreased to 100° C. or below, to obtain various sintered materials of pellet form.

The cross-section of each sintered material of pellet form was polished and observed under an optical microscope to examine the dispersion state of $RE_2BaCuO_5$ phase. The average particle diameter and maximum particle diameter of the $RE_2BaCuO_5$ were determined by image analysis and the results are shown in Table 1, 2, 3 or 4.

A cubic sample of 3 mm×3 mm×3 mm was cut out from each sintered material and measured for hysteresis of magnetization at 77K using a magnetometer. From the measurement was calculated a Jc (A/cm²) at a magnetic field of 1T. The calculation results are shown in Table 1, 2, 3 or 4.

TABLE 1

| Run No. | Minor RE element added Addition Form | Minor RE element added Content* (Wt. %) | Average particle diameter ($\mu$m) | Maximum particle diameter ($\mu$m) | Jc (A/cm²) |
|---|---|---|---|---|---|
| Example 1 | | | | | |
| 1-1 | $CeO_2$ | 0.1 | 4 | 12 | 12000 |
| 1-2 | $CeO_2$ | 0.5 | 3 | 10 | 14000 |
| 1-3 | $CeO_2$ | 1 | 3 | 10 | 15000 |
| 1-4 | $CeO_2$ | 2 | 3 | 10 | 15000 |
| 1-5 | $CeO_2$ | 5 | 3 | 10 | 14000 |
| 1-6 | $CeO_2$ | 10 | 4 | 12 | 12000 |
| 1-7 | $Nd_2O_3$ | 0.1 | 5 | 15 | 8000 |
| 1-8 | $Nd_2O_3$ | 2 | 4 | 10 | 10000 |
| 1-9 | $Nd_2O_3$ | 5 | 6 | 15 | 8000 |
| 1-10 | $Nd_2O_3$ | 10 | 7 | 20 | 8000 |
| 1-11 | $Sm_2O_3$ | 0.1 | 5 | 15 | 8000 |
| 1-12 | $Sm_2O_3$ | 2 | 4 | 10 | 10000 |
| 1-13 | $Sm_2O_3$ | 5 | 5 | 15 | 9000 |
| 1-14 | $Sm_2O_3$ | 10 | 4 | 10 | 11000 |
| 1-15 | $Eu_2O_3$ | 0.1 | 5 | 15 | 8000 |
| 1-16 | $Eu_2O_3$ | 2 | 5 | 15 | 8000 |
| 1-17 | $Eu_2O_3$ | 5 | 6 | 20 | 7000 |
| 1-18 | $Eu_2O_3$ | 10 | 7 | 20 | 6000 |

*Content in the sintered material obtained

TABLE 2

| Run No. | Minor RE element added Addition Form | Minor RE element added Content* (Wt. %) | Average particle diameter (μm) | Maximum particle diameter (μm) | Jc (A/cm$^2$) |
|---|---|---|---|---|---|
| Example 1 | | | | | |
| 1-19 | Gd$_2$O$_3$ | 0.1 | 5 | 15 | 7000 |
| 1-20 | Gd$_2$O$_3$ | 2 | 5 | 15 | 8000 |
| 1-21 | Gd$_2$O$_3$ | 5 | 6 | 20 | 6000 |
| 1-22 | Gd$_2$O$_3$ | 10 | 7 | 20 | 6000 |
| 1-23 | Tb$_2$O$_3$ | 0.1 | 5 | 15 | 9000 |
| 1-24 | Tb$_2$O$_3$ | 2 | 4 | 15 | 11000 |
| 1-25 | Tb$_2$O$_3$ | 5 | 6 | 20 | 7000 |
| 1-26 | Tb$_2$O$_3$ | 10 | 6 | 20 | 6000 |
| 1-27 | Dy$_2$O$_3$ | 0.1 | 7 | 20 | 6000 |
| 1-28 | Dy$_2$O$_3$ | 2 | 7 | 20 | 6000 |
| 1-29 | Dy$_2$O$_3$ | 5 | 6 | 20 | 7000 |
| 1-30 | Dy$_2$O$_3$ | 10 | 5 | 15 | 11000 |
| 1-31 | Ho$_2$O$_3$ | 0.1 | 6 | 15 | 9000 |
| 1-32 | Ho$_2$O$_3$ | 2 | 5 | 10 | 10000 |
| 1-33 | Ho$_2$O$_3$ | 5 | 4 | 10 | 11000 |
| 1-34 | Ho$_2$O$_3$ | 10 | 5 | 10 | 10000 |

*Content in the sintered material obtained

TABLE 3

| Run No. | Minor RE element added Addition Form | Minor RE element added Content* (Wt. %) | Average particle diameter (μm) | Maximum particle diameter (μm) | Jc (A/cm$^2$) |
|---|---|---|---|---|---|
| Example 1 | | | | | |
| 1-35 | Er$_2$O$_3$ | 0.1 | 6 | 15 | 8000 |
| 1-36 | Er$_2$O$_3$ | 2 | 6 | 15 | 8000 |
| 1-37 | Er$_2$O$_3$ | 5 | 6 | 15 | 7000 |
| 1-38 | Er$_2$O$_3$ | 10 | 7 | 20 | 6000 |
| 1-39 | Tm$_2$O$_3$ | 0.1 | 6 | 15 | 9000 |
| 1-40 | Tm$_2$O$_3$ | 2 | 5 | 10 | 10000 |
| 1-41 | Tm$_2$O$_3$ | 5 | 6 | 15 | 8000 |
| 1-42 | Tm$_2$O$_3$ | 10 | 6 | 15 | 7000 |
| 1-43 | Yb$_2$O$_3$ | 0.1 | 7 | 20 | 7000 |
| 1-44 | Yb$_2$O$_3$ | 2 | 7 | 20 | 7000 |
| 1-45 | Yb$_2$O$_3$ | 5 | 6 | 15 | 8000 |
| 1-46 | Yb$_2$O$_3$ | 10 | 5 | 15 | 10000 |
| 1-47 | Lu$_2$O$_3$ | 0.1 | 6 | 15 | 9000 |
| 1-48 | Lu$_2$O$_3$ | 2 | 5 | 10 | 10000 |
| 1-49 | Lu$_2$O$_3$ | 5 | 5 | 15 | 10000 |
| 1-50 | Lu$_2$O$_3$ | 10 | 6 | 15 | 9000 |

*Content in the sintered material obtained

TABLE 4

| Run No. | Minor RE element added Addition Form | Minor RE element added Content* (Wt. %) | Average particle diameter (μm) | Maximum particle diameter (μm) | Jc (A/cm$^2$) |
|---|---|---|---|---|---|
| Example 1 | | | | | |
| 1-51 | — | — | 15 | 40 | 3000 |
| 1-52 | La$_2$O$_3$ | 0.1 | 20 | 50 | 1000 |
| 1-53 | La$_2$O$_3$ | 2 | 15 | 40 | 2500 |
| 1-54 | La$_2$O$_3$ | 5 | 15 | 40 | 3000 |
| 1-55 | La$_2$O$_3$ | 10 | 20 | 50 | 1000 |
| 1-56 | Pr$_6$O$_{11}$ | 0.1 | 15 | 30 | 3000 |
| 1-57 | Pr$_6$O$_{11}$ | 2 | 15 | 40 | 3500 |
| 1-58 | Pr$_6$O$_{11}$ | 5 | 15 | 40 | 500 |
| 1-59 | Pr$_6$O$_{11}$ | 10 | 20 | 50 | 500 |
| 1-60 | CeO$_2$ | 0.04 | 12 | 25 | 4000 |
| 1-61 | CeO$_2$ | 20 | 15 | 30 | 3500 |
| 1-62 | Ag | 2 | 15 | 40 | 3500 |
| 1-63 | Ag | 5 | 15 | 40 | 2000 |
| 1-64 | Ag | 10 | 20 | 50 | 500 |

*Content in the sintered material obtained

As is clear from the above Example, an oxide superconducting material containing a dispersed RE$_2$BaCuO$_5$ phase of 20 μm or less in maximum diameter and giving a high Jc of 6,000 A/cm$^2$ or more can be obtained by allowing said superconducting material to contain, in addition to a major RE component (Y in the Example), a minor RE component in an amount of 0.1-10% by weight as oxide. When the minor RE component is Ce, in particular, the dispersed RE$_2$BaCuO$_5$ phase has a maximum particle diameter of 12 μm or less and there is obtained a preferable Jc of 12,000 A/cm$^2$ or more. When there is contained, as the minor RE component, Sm, Ho or Lu in an amount of 2-10% by weight as oxide, or Tm, Nd or Tb in an amount of 2% by weight as oxide, or Dy or Yb in an amount of 10% by weight as oxide, there is obtained a Jc of 10,000 A/cm$^2$ or more. Meanwhile, in the Comparative Example (Run Nos. 1-60 and 1-61) wherein the minor RE component is Ce but is contained in an amount of 0.04 or 20% by weight as oxide, the obtained Jc is as low as 4,000 A/cm$^2$ or less. Also when no minor RE component is added or a non-RE element (Ag) powder is added, the obtained Jc is as low as 3,500 A/cm$^2$ or less. Also when La or Pr is added as the main RE component, the obtained Jc is as low as 3,000 A/cm$^2$ or less.

EXAMPLE 2 AND COMPARATIVE EXAMPLES 2 AND 3

Powders of BaCO$_3$ and CuO were compounded so that the atomic ratio of Ba and Cu became 2.25:3.25, and mixed by a dry mixer for 1 hour. The resulting mixed powder was calcined in air at 850° C. for 10 hours. To the calcined product were added powders of Y$_2$O$_3$ and CeO$_2$ so that the atomic ratio of Y:Ce:Ba:Cu became 1.5:0.09:2.25:3.25. They were ground and mixed for 15 hours by a dry mixer using zirconia flint pebbles. In this case, the CeO$_2$ content in the product was 2% by weight.

In Comparative Example 2, the same procedure as above was employed except that no CeO$_2$ powder was added.

In Comparative Example 3, in accordance with the conventional QMG process disclosed in Japanese Patent Application Laid-Open No. 153803/1990, powders of Y$_2$O$_3$, CeO$_2$, BaCO$_3$ and CuO were compounded so that the atomic ratio of Y:Ce:Ba:Cu became 1.5:0.09:2.25:3.25, and mixed by a dry mixer for 1 hour; the resulting mixed powder was placed in a platinum crucible and melted in air at 1,400° C. for 3 minutes; the melt was cast between a stainless-steel twin-roller for quenching and solidification; and the resulting solid was ground and mixed in ethyl alcohol for 15 hours by a wet mixer using zirconia flint pebbles. The same procedure was repeated for a case using no CeO$_2$ powder.

Each of the above obtained mixed powders was subjected to molding, incongruent melting, slow cooling and heat treatment in a manner similar to Example 1, to obtain sintered materials (Example 2: Run No. 2-1, Comparative Example 2: Run No. 2-2, Comparative Example 3: Run Nos. 2-3 and 2-4). Each sintered material was subjected to surface observation and measurement of hysteresis of magnetization, and a Jc was calculated. The results are shown in Table 5.

TABLE 5

| | Run No. | Ce addition | Average particle diameter (μm) | Maximum particle diameter (μm) | Jc (A/cm$^2$) |
|---|---|---|---|---|---|
| Example 2 | 2-1 | Presence | 4 | 10 | 14000 |
| Comparative 2 | 2-2 | Absence | 10 | 30 | 3000 |
| Compara- | 2-3 | Presence | 3 | 10 | 14000 |

TABLE 5-continued

| Run No. | Ce addition | Average particle diameter (μm) | Maximum particle diameter (μm) | Jc (A/cm²) |
|---|---|---|---|---|
| tive 3 2-4 | Absence | 3 | 10 | 15000 |

When raw material powders are not subjected to melting and quenching, the resulting sintered material containing Ce (Run No. 2-1) according to the present invention shows a high Jc, while the sintered material containing no Ce (Run No. 2-2) according to Comparative Example 2 shows a low Jc of 3,000 A/cm². In contrast, when raw material powders are subjected to melting and quenching in accordance with the conventional QMG process, a high Jc of 14,000 A/cm² or more is obtained regardless of addition or no addition of Ce. Therefore, it is obvious that the use of the minor RE component in addition to the major RE component is very effective in the present melting process for producing an oxide superconducting material.

EXAMPLE 3 AND COMPARATIVE EXAMPLE 4

A calcined powder was obtained in the same manner as in Example 1 except that raw material powders of $Er_2O_3$, $BaO_2$ and CuO were compounded so that the atomic ratio of Er, Ba and Cu became 1.50:2.25:3.25. To the powder was added $CeO_2$ so that the $CeO_2$ content in the sintered material obtained became as shown in Table 6, and the same procedure as in Example 1 was repeated to obtain sintered materials (Example 3: Run Nos. 3-1 to 3-6, Comparative Example 4: Run No. 3-7).

In the same manner as in Example 1, each sintered material was subjected to surface observation, measurement of hysteresis of magnetization and calculation of Jc. The results are shown in Table 6.

TABLE 6

| | Run No. | $CeO_2$ content* (Wt. %) | Average particle diameter (μm) | Maximum particle diameter (μm) | Jc (A/cm²) |
|---|---|---|---|---|---|
| Example 3 | 3-1 | 0.1 | 5 | 15 | 10000 |
| | 3-2 | 0.5 | 3 | 10 | 13000 |
| | 3-3 | 1 | 4 | 12 | 12000 |
| | 3-4 | 2 | 4 | 12 | 13000 |
| | 3-5 | 5 | 4 | 12 | 12000 |
| | 3-6 | 10 | 5 | 15 | 10000 |
| Compara- | 3-7 | 0 | 10 | 30 | 2500 |

TABLE 6-continued

| Run No. | $CeO_2$ content* (Wt. %) | Average particle diameter (μm) | Maximum particle diameter (μm) | Jc (A/cm²) |
|---|---|---|---|---|
| tive 4 | | | | |

*Content in the sintered material obtained

EXAMPLE 4

A calcined powder was obtained in the same manner as in Example 1 except that raw material powders of $Y_2O_3$, BaO and CuO were compounded so that the atomic ratio of Y, Ba and Cu became 1.40:2.25:3.25. To the calcined powder was added an Ag powder so that the Ag content in the fired product became 1% by weight in form of the element. There was further added $CeO_2$ so that the $CeO_2$ content in the fired product became as shown in Table 7. Then, the same procedure as in Example 1 was repeated to obtain sintered materials.

In the same manner as in Example 1, each sintered material was subjected to surface observation, measurement of hysteresis of magnetization and calculation of Jc. The results are shown in Table 7.

TABLE 7

| Run No. | Ag content* (Wt. %) | $CeO_2$ content* (Wt. %) | Average particle diameter (μm) | Maximum particle diameter (μm) | Jc (A/cm²) |
|---|---|---|---|---|---|
| Example 4 | | | | | |
| 4-1 | 1 | 0.5 | 4 | 10 | 13000 |
| 4-2 | 1 | 1 | 4 | 10 | 14000 |
| 4-3 | 1 | 2 | 4 | 10 | 14000 |
| 4-4 | 1 | 5 | 4 | 12 | 13000 |
| 4-5 | 1 | 10 | 4 | 12 | 12000 |

*Content in the sintered material obtained

What is claimed is:
1. A RE-Ba-Cu-O type oxide superconducting material, comprising:
  a matrix of grains of $REBa_2Cu_3O_y$ and, uniformly dispersed therein, fine particles of $RE_2BaCuO_5$, wherein RE is at least one element selected from the group consisting of Y, Nd, Sm, Eu, Gd, Dy, Ho, Er, Tm, Yb, and Lu; and
  Ce in an amount of 0.1–10% by weight in terms of its oxide (IV) based on said RE-Ba-Cu-O type oxide superconducting material.
2. A RE-Ba-Cu-O type oxide superconducting material according to claim 1 wherein said fine particles have diameters of up to 20 μm.
3. A RE-Ba-Cu-O type oxide superconducting material according to claim 1 wherein RE is one element selected from the group consisting of Y, Nd, Sm, Eu, Gd, Dy, Ho, Er, Tm, Yb, and Lu.

* * * * *